April 28, 1964 D. J. SHOMBERT 3,131,305
SEMICONDUCTOR RADIATION DETECTOR
Filed May 12, 1961
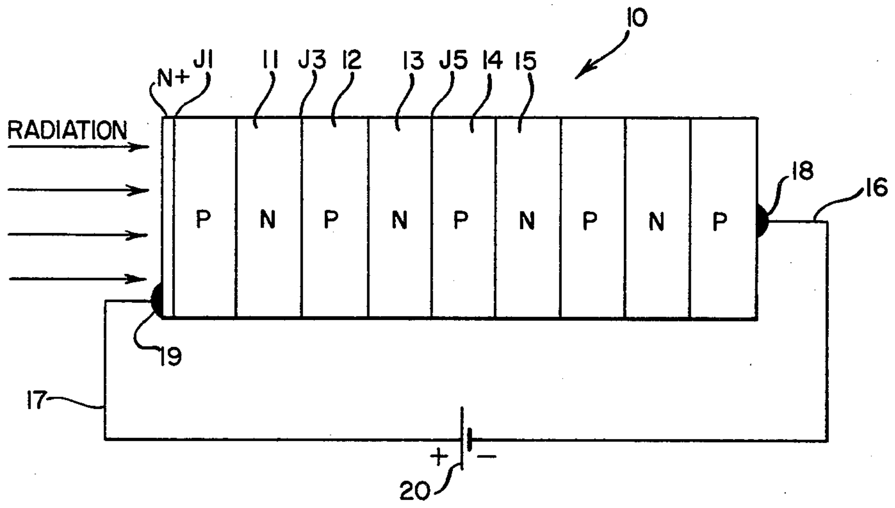
INVENTOR
DONALD J. SHOMBERT
BY [signature]
ATTORNEY United States Patent Office 3,131,305
Patented Apr. 28, 1964

3,131,305

SEMICONDUCTOR RADIATION DETECTOR

Donald J. Shombert, Berkeley Heights, N.J., assignor to Merck & Co., Inc., Rahway, N.J., a corporation of New Jersey Filed May 12, 1961, Ser. No. 109,586
3 Claims. (Cl. 250—83.3)

This invention relates to semiconductor devices and more particularly to a semiconductor radiation detector structure for use in detecting and counting high energy particles.

A radiation detector is an apparatus which can collect and count high energy particles. A particular feature of such an apparatus is its ability to distinguish particles of different energies. For example, the apparatus should be capable of separately counting such radiation as alpha-particles in the presence of gamma-radiation. In the conventional radiation detector apparatus a reverse-biased P–N junction is utilized. Particles which are absorbed in the depletion layer of the junction generate electron-hole carrier pairs in the depletion layer. Under the influence of the applied electric field the electrons flow to the N-side of the junction and the holes to the P-side of the junction. Thus the radiation energy can be considered as equivalent to a current impulse across the depletion layer.

In order to collect all the high-energy, long-range particles a junction having a very wide depletion layer is necessary. The width of the depletion layer is proportional to the square root of the resistivity of the semiconductor material in the layer and to the square root of the magnitude of the applied bias voltage. Accordingly, a conventional radiation detector is constructed from very high resistivity semiconductor material, for example, silicon having a resistivity of 1,000 ohm.-cm. or greater. Such a device consists of a relatively thick layer of the semiconductor material onto which is alloyed or otherwise formed a lower resistivity layer of opposite conductivity type and of a thickness in the order of 1 micron or less. Ohmic contacts then are made to each of the layers of semiconductor material. In operation, a very high reverse bias voltage is applied to the device to produce a wide depletion layer within the semiconductor material. Typically, for example, at 5,000 volts reverse bias applied to 1,000 ohm-cm. P-type silicon, a depletion layer about 30 mils is produced.

An object of the present invention is to provide a semiconductor device for detecting radiation.

Another object of the present device is to provide a semiconductor radiation detector structure which is capable of detecting high energy particles with a minimum applied bias.

Still another object of this invention is to provide a semiconductor structure for detecting radiation using semiconductor material of a relatively low resistivity.

These and other objects will be made apparent in a more particular description of the invention in which reference will be made to the accompanying drawing, in which the figure is a schematic diagram in section of the radiation detector structure according to the present invention.

In accordance with the present invention the foregoing objects and advantages have been achieved by providing a semiconductor structure including a plurality of contiguous layers of semiconductor material of alternating opposite conductivity type thereby forming a plurality of contiguous junctions. Each of the layers are of a predetermined thickness and a relatively low resistivity. In a preferred form of the invention, alternating junctions in the structure of the present invention are reverse-biased with a relatively low voltage to provide the desired wide depletion layer. The depletion layers of each of the reversed-biased junction preferably are made to overlap to form a composite depletion layer in which the structure functions as a single reverse-biased junction.

Referring now to the figure, there is shown in schematic form a sectional diagram of the semiconductor device 10 of the present invention used particularly to detect high energy radiation particles. As is shown therein, the device includes a plurality of layers of semiconductor material alternating in conductivity type; for example, layers 12 and 14 may be of P-type conductivity while contiguous adjacent layers 11, 13 and 15 are of N-type conductivity.

A preferred method of forming the semiconductor structure of the present invention is by vapor deposition of the semiconductor material. In this method the semiconductor material along with a predetermined concentration of active impurity material of prescribed conductivity type is deposited upon a heated essentially single crystalline semiconductor starting element from a decomposable source other of in a reactor. After a predetermined period of time during which the desired thickness of semiconductor material in the vapor-deposited layer has been formed the conductivity type of active impurity material within the decomposable source material is changed to provide a second layer of semiconductor material of opposite conductivity type. After a second predetermined period of time during which the desired thickness of the second layer of semiconductor material has been deposited upon the first vapor-deposited layer of opposite conductivity type, the kind of active impurity material contained within the decomposable source is again changed to the original type impurity to provide a third layer of semiconductor material having a conductivity like that of the first layer. Thereafter the process is repeated to provide any number of layers of semiconductor material of alternating conductivity type and of a predetermined thickness and resistivity in accordance with the length of time of vapor deposition and of the concentration of impurity material. The semiconductor radiation detector structure of the present invention may be constructed of any semiconductor material presently known in the art, for example, the detector device may be constructed of silicon, germanium, silicon germanium alloy silicon carbide, Group III–V intermetallic compounds such as gallium arsenide, indium phosphide, aluminum antimonide, indium antimonide, and the like; however for purposes of description the present discussion of the semiconductor radiation detector in accordance with the present invention will be given with particular reference to silicon as the semiconductor material.

The following more detailed description of the structure of the present invention will be understood to be for purposes of illustration of the principle of the invention only and that the invention is not to be limited thereto.

Accordingly there is provided a single crystalline semiconductor substrate member of, for example, a P-type silicon semiconductor layer having a low resistivity of 100 ohm-cm. and having a thickness of about 2 mils. The impurity concentration in this layer is about $10^{14}$ carriers per cc. Onto said layer from the vapor phase an N-type silicon semiconductor layer having a low resistivity of 40 ohm-cm. is deposited to a thickness of about 2 mils. The process is repeated until a succession of layers is produced. Then an N+ silicon semiconductor layer having a resistivity of about 0.002 ohm-cm. and a thickness of 1 micron is formed. Finally electrical connectors 16 and 17 are affixed to opposite ends of the structure by way of ohmic contacts 18 and 19 respectively. The device is then provided with a source of potential 20 to bias junctions J1, J3, J5 and so forth in a reverse direction. A bias voltage of 200 volts will punch through each layer. A total of only 3000 volts therefore is required to produce a total depletion-layer width of 30 mils in a structure having 15 layers of semiconductor material.

In the preferred embodiment of the invention herein described, the layer thicknesses are predetermined to be greater than the diffusion length of minority carriers in the layer thereby preventing carriers from traversing regions of opposite conductivity type. A lifetime in the order of 0.05 microsecond or less is preferred for the semiconductor material in the structure.

The radiation detector device of the present invention offers considerable advantage over existing devices performing a similar function in that low resistivities of 40 ohm-cm. and 100 ohm-cm. are used instead of 1000 ohm-cm., a bias voltage of 3000 volts instead of 5000 volts is required and each individual junction is required to withstand only 200 volts.

While a specific number and thickness of layers have been described, it will be understood that these values may be varied to further reduce the required bias voltage to punch through the junctions. For example, a structure having 20 layers each of which is 1.5 mils thick with similar resistivities for P and N will require only 2000 volts to provide a depletion layer of 30 mils. In such a structure each junction is required to withstand only 100 volts.

While the invention has been described with particular reference to certain embodiments thereof it will be understood that other modifications may be made within the scope of the art without departing from the scope and spirit of the invention.

I claim:

1. A radiation detector for high energy particles comprising a plurality of contiguous layers of semiconductor material of alternating conductivity type and of a predetermined thickness and resistivity, thereby forming a plurality of junctions, the diffusion length of minority carriers in each of said layers being small in comparison with the thickness of said layer; and means for biasing alternate junctions in a reverse direction thereby to form a wide depletion region to collect said particles.

2. A semiconductor radiation detector structure for collecting high energy particles at low bias voltages comprising a plurality of contiguous layers of semiconductor material, each of said layers being of a predetermined thickness and resistivity, alternate layers being of opposite conductivity type thereby forming a plurality of junctions, the diffusion length of minority carriers in each of said layers being small in comparison to the thickness of said layer; and means for biasing every other junction in a reverse direction; the bias voltage being of a magnitude in accordance with said predetermined resistivities and thicknesses sufficient to form a composite wide depletion region throughout said structure to collect said particles.

3. The structure in accordance with claim 2 wherein said semiconductor material is relatively low resistivity silicon.

References Cited in the file of this patent

UNITED STATES PATENTS

| | | |
|---|---|---|
| 2,847,585 | Christian | Aug. 12, 1958 |
| 2,952,817 | Kennedy | Sept. 13, 1960 |
| 2,988,639 | Welker | June 13, 1961 |
| 2,988,677 | Miller | June 13, 1961 |
| 3,035,213 | Schmidt | May 15, 1962 |
| 3,078,328 | Jones | Feb. 19, 1963 |

OTHER REFERENCES

Uses of Semiconductor Detectors in Health-Physics Monitoring, by A. R. Jones, from Nucleonics, vol. 18, No. 10, October 1960, pp. 86 to 91.